United States Patent
Lambertini et al.

(10) Patent No.: US 7,172,795 B2
(45) Date of Patent: Feb. 6, 2007

(54) METHOD FOR MAKING THREE-DIMENSIONAL STRUCTURES HAVING NANOMETRIC AND MICROMETRIC DIMENSIONS

(75) Inventors: Vito Lambertini, Giaveno (IT); Piermario Repetto, Turin (IT); Piero Perlo, Sommariva Bosco (IT)

(73) Assignee: C.R.F. Societa Consortile per Azioni, Orbassano (IT)

(*) Notice: Subject to any disclaimer, the term of this patent is extended or adjusted under 35 U.S.C. 154(b) by 0 days.

(21) Appl. No.: 10/656,124

(22) Filed: Sep. 8, 2003

(65) Prior Publication Data
US 2004/0180179 A1 Sep. 16, 2004

(30) Foreign Application Priority Data
Sep. 5, 2002 (IT) .......................... TO2002A0772

(51) Int. Cl.
C08J 7/04 (2006.01)
C08J 7/18 (2006.01)
C08F 2/48 (2006.01)
B05D 3/06 (2006.01)
B05D 7/24 (2006.01)
B05D 1/40 (2006.01)
B05D 5/00 (2006.01)

(52) U.S. Cl. ...................... 427/510; 427/514; 427/492; 427/550; 427/128; 427/130

(58) Field of Classification Search ................ 427/510, 427/511, 514, 544, 543, 547, 550, 128, 130, 427/458, 466, 468, 472, 474
See application file for complete search history.

(56) References Cited

U.S. PATENT DOCUMENTS

| 2,570,856 | A |   | 10/1951 | Pratt et al. |   |
|---|---|---|---|---|---|
| 5,522,962 | A | * | 6/1996 | Koskenmaki et al. | 156/272.4 |
| 6,103,361 | A |   | 8/2000 | Batzar et al. |   |
| 6,180,226 | B1 | * | 1/2001 | McArdle et al. | 428/332 |
| 6,216,538 | B1 | * | 4/2001 | Yasuda et al. | 73/570.5 |
| 6,248,435 | B1 |   | 6/2001 | Leck |   |
| 6,391,393 | B1 | * | 5/2002 | Martin et al. | 427/487 |
| 6,590,707 | B1 | * | 7/2003 | Weber | 359/498 |
| 6,808,806 | B2 | * | 10/2004 | Phillips et al. | 428/403 |
| 6,818,155 | B2 | * | 11/2004 | Hsieh et al. | 252/511 |

FOREIGN PATENT DOCUMENTS

| EP | 0 710 508 A1 |   | 5/1996 |   |
|---|---|---|---|---|
| JP | 61-19842 A | * | 9/1986 | 427/128 |

OTHER PUBLICATIONS

Copy of European Search Report dated Nov. 10, 2005.

* cited by examiner

Primary Examiner—Marianne Padgett
(74) Attorney, Agent, or Firm—Sughrue Mion, PLLC

(57) ABSTRACT

A method for making three-dimensional structures of nanometric or micrometric dimensions comprises the following steps: obtaining of a photopolymeric or UV mixture including nanoparticles orientable in space; deposition of a layer of the mixture on a respective substrate; exposure of the layer to UV-radiation and control of the polymerization of the mixture by means of variation of its index of refraction; application of a magnetic and/or electrical field for producing a desired positioning of the nanoparticles, in order to induce the growth of surface projections from the layer of mixture; and polymerization of the mixture.

16 Claims, 4 Drawing Sheets

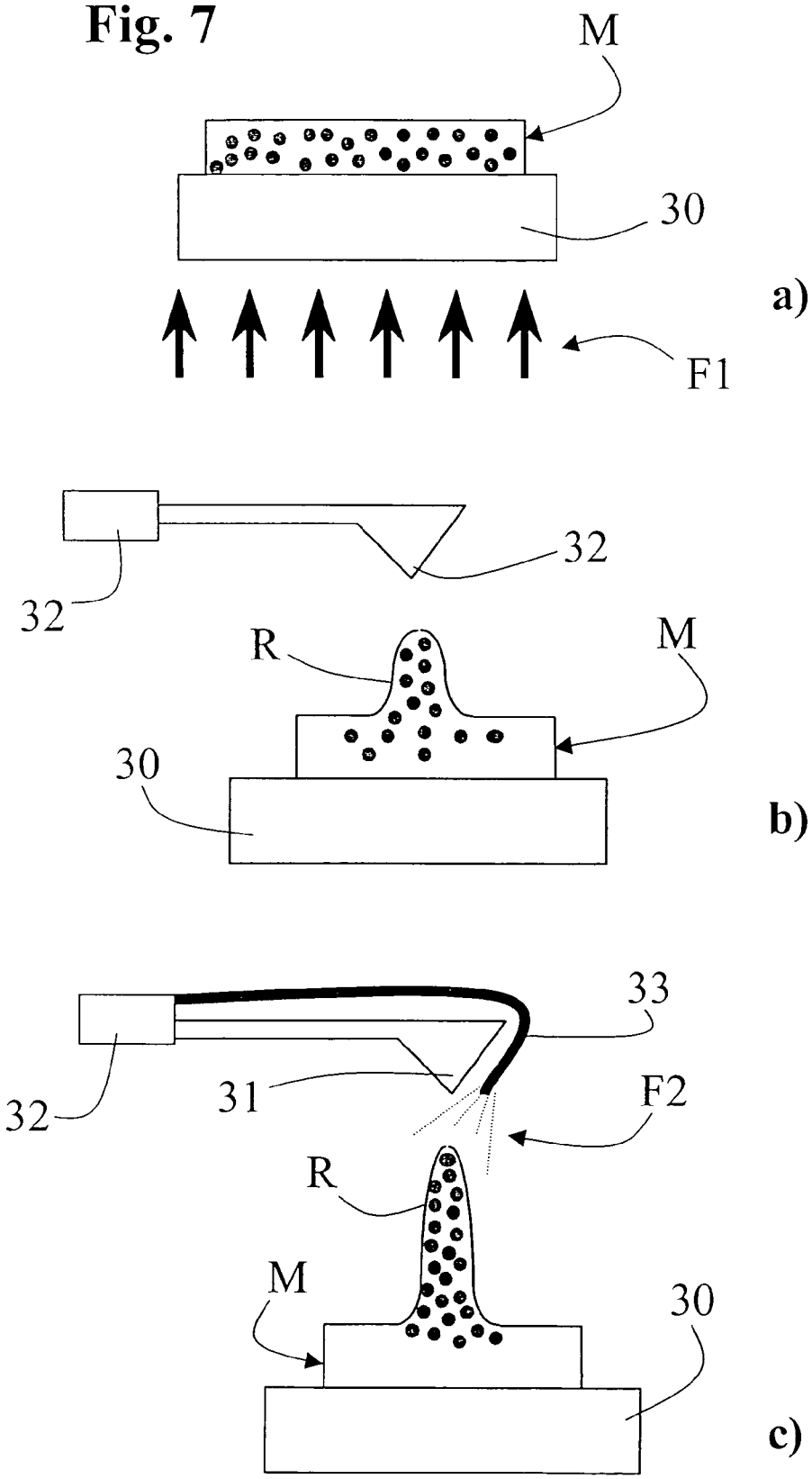

METHOD FOR MAKING THREE-DIMENSIONAL STRUCTURES HAVING NANOMETRIC AND MICROMETRIC DIMENSIONS

BACKGROUND OF THE INVENTION

The present invention relates to a method for making three-dimensional structures of nanometric or micrometric dimensions.

In certain technological sectors there are currently used components provided with surface projections having a height of up to 500 micron and arranged according to definite geometries, for example to form channels.

Components characterized by three-dimensional surface structures of the kind indicated are typically used in micro-electro-mechanical systems (MEMS), for the purposes of producing lighting devices, micromechanical devices and microfluidic devices, for example for the production of diffractive optical devices, medical devices, microturbines, etc.

In the state of the art, the aforesaid surfaces with projections of nanometric or micrometric dimensions arranged according to pre-defined patterns are not obtainable by means of processes of machining. To obtain said three-dimensional structures, more or less conventional photolithographic technologies are hence used, according to the height and the type of the projections desired.

The photolithographic processes used for this purpose are extremely complex and costly. Another drawback of the photolithographic processes is that they do not enable three-dimensional structures with high aspect ratio, understood as ratio between the height of a projection and the distance of the latter from an adjacent projection, to be obtained.

SUMMARY OF THE INVENTION

The purpose of the present invention is to indicate a new method that will enable three-dimensional nanometric or micrometric structures to be produced having characteristics similar to those obtainable using photolithographic technologies, but with a considerable reduction in costs and complexity with respect to the latter.

The above and yet other purposes are achieved, according to the present invention, by a method for making three-dimensional structures of nanometric or micrometric dimensions, in particular of surfaces from which there rise projections having a height of up to 500 micron arranged according to definite geometries, characterized in that it comprises the following steps:

obtaining of a photopolymeric or UV mixture including nanoparticles orientable in space;

deposition of a layer of the mixture on a respective substrate;

exposure of the layer to UV-radiation and control in real time of the state of polymerization;

application of a magnetic and/or electrical field capable of producing a desired orientation or positioning of the nanoparticles for the purposes of growing surface projections from the layer; and polymerization of the mixture.

Preferred characteristics of the method according to the invention are indicated in the attached claims, which are understood as forming an integral part of the present description.

BRIEF DESCRIPTION OF THE DRAWINGS

Further purposes, characteristics and advantages of the present invention will emerge clearly from the ensuing detailed description and from the annexed drawings, which are provided purely by way of an explanatory and non-limiting example and in which:

FIG. 7 is a schematic representation of the principle of operation of an apparatus used for the purposes of formation of three-dimensional nanometric structures according to the invention;

DETAILED DESCRIPTION OF THE INVENTION

As mentioned previously, the idea underlying the present invention is that of using, for the purposes of production of three-dimensional nanometric or micrometric structures, photopolymers combined with nanoparticles orientable in space by means of a magnetic or electrical field.

According to the invention, then, in a photopolymeric or UV mixture there are introduced one or more orientable substances, which render the mixture itself sensitive to the action of an external force, in particular an electrical or magnetic field. Said external field is appropriately modulated outside the system, in order to enable growth in height of the desired surface projections and to improve the control of their geometrical definition.

The UV mixtures used for the purposes of the implementation of the invention may be of a type in itself known and constituted by acrylated oligomers and monomers. On the other hand, the substances with characteristics of orientability in the presence of electrical or magnetic fields may be constituted by ferrofluids, electro-rheological materials, liquid crystals or magneto-rheological materials, which are also in themselves known.

Figure 1:
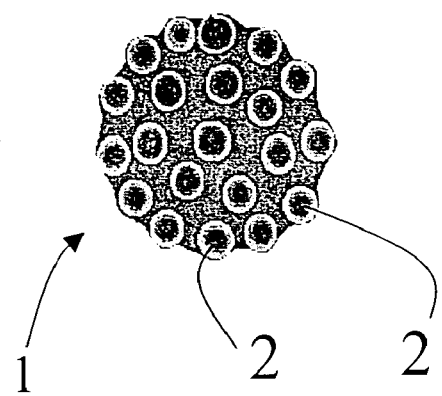
FIG. 1 is a schematic representation of a microparticle of a mixture of photopolymers used in the method according to the invention.
Figure 2:
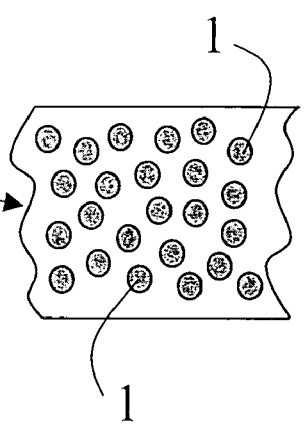
FIGS. 2 and 3 are schematic representations of the behaviour of microparticles of the type of the one represented in FIG. 1, respectively in the absence and in the presence of an external magnetic field.
Figure 3:
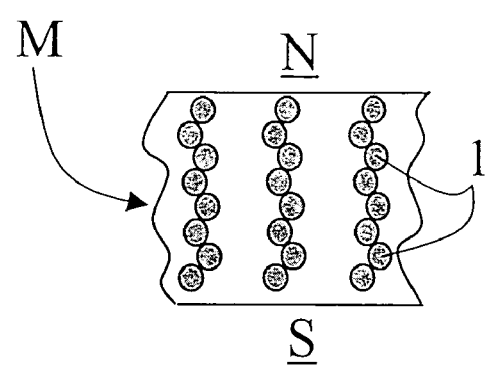

In order to illustrate in a schematic form the principle on which the invention is based, FIG. 1 is a schematic representation of a microparticle 1 in a photopolymeric matrix of a mixture used in the method according to the invention, which includes orientable nanoparticles 2, which here are assumed to be nanomagnets. In FIG. 2 a photopolymeric mixture M including the nanoparticles 1 is represented schematically in the absence of a magnetic field, whilst in FIG. 3 the same mixture M is represented in the presence of a magnetic field. As emerges from the comparison between FIGS. 2 and 3, the application of a magnetic field appropriately polarised enables the desired orientation of the nanoparticles 1 to be obtained by virtue of the presence therein of the nanomagnets 2.

According to the invention, two different operating methodologies may be envisaged, usable according to the nanometric and micrometric dimensions of the surface projections that it is intended to obtain, and in particular for the formation of micrometric structures, with dimensions of the projections from approximately 50 to approximately 500 micron, and for the formation of nanometric structures, with dimensions of the projections from approximately some 50 nanometers to one micron.

The methodology used for generating three-dimensional micrometric structures with high aspect ratio according to the invention can envisage the following steps:

1) solubilization of the orientable nanoparticles in the photopolymeric or UV mixture;
2) deposition of the UV mixture, in the form of a viscous liquid film, on a binary mask or half-tone mask;
3) exposure to UV-radiation of the mixture through the aforesaid mask and in the presence of an electrical and/or magnetic field, for determining the desired growth of the surface projections, with the control of the state of polymerization of the mixture; and
4) conclusive polymerization of the mixture.

The operating steps 1) and 2) can be carried out using techniques in themselves known, and hence will not be described herein; the same applies as regards the production of the mask referred to in step 2).

Figure 4:
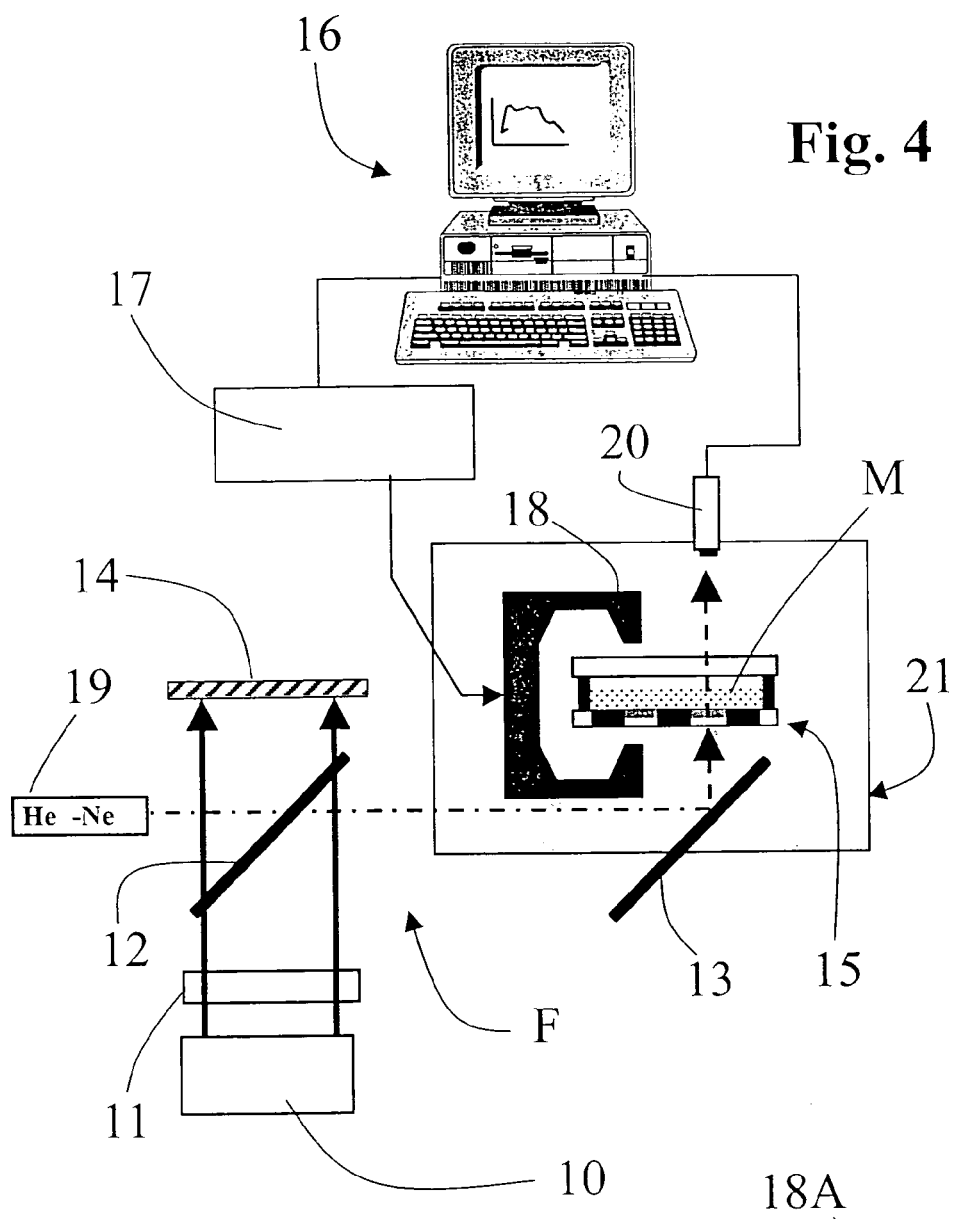
FIG. 4 is a schematic representation of an apparatus used for the purposes of formation of three-dimensional micrometric structures according to the invention.

FIG. 4 represents a possible embodiment of an apparatus usable for the purposes of carrying out step 3).

In FIG. 4, the reference number 10 designates a generic source of UV radiation, such as a UV lamp, downstream of which is provided an IR filter, designated by 11.

The reference numbers 12, 13 and 14 designate, respectively, a first dichroic mirror, a second dichroic mirror, and a black screen. The components 12, 13 and 14 are used for directing a beam of UV radiation, designated by F, produced by means of the lamp 10, at a binary mask or a half-tone mask, designated by 15. On the latter is deposited, with modalities in themselves known, the mixture M in the form of a viscous liquid film.

Designated by 16 is a personal computer, which is operative for controlling, in addition to the lamp 10, also the power supply 17 of an electromagnet 18, the latter being envisaged for applying an electrical or magnetic field to the mixture M during exposure to UV radiation.

The system of control of the polymerization of the mixture M by means of UV radiation provides in real time for the variation of the index of refraction of the liquid mixture M in the areas with different degrees of cross-linking and modification of the intensity of the field produced by the electromagnet 18. For this purpose, by means of a laser designated by 19 it is possible to control in real time the distribution of the intensity in the orders of diffraction resulting from the superposition of the lattice present on the mask and of the lattice consisting of the UV mixture in the polymerization step. Said distribution of the intensity of the orders of diffraction is detected by a television camera, designated by 20, located at some centimeters from the mask 15.

The UV radiation F is modulated as it passes through the lattice of the mask 15 and produces in time a modulation of the index of refraction of the photopolymeric mixture M. This modulation is linked to the different state of cross-linking achieved by the regions illuminated by different intensities.

The mixture M is subjected simultaneously to UV radiation F and to the external magnetic or electrical field generated by the electromagnet 18 in an inert environment so as to prevent the inhibiting action of oxygen. In the example of FIG. 4, said inert environment is provided by a chamber 21 containing nitrogen.

The combination of the external field generated by the electromagnet 18 and of the UV radiation by means of alignment of the field lines, of the beam F and of the mask 15 enables three-dimensional structures with high aspect ratio to be obtained.

Figure 5:
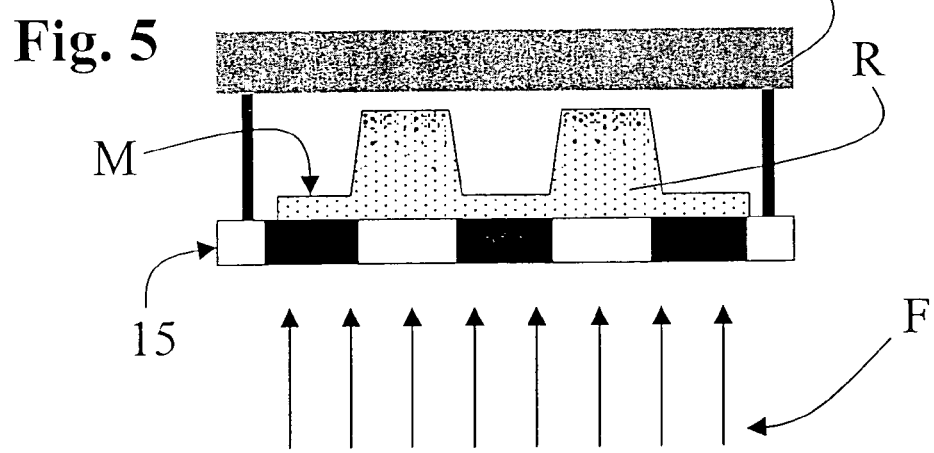

FIG. 5 is a schematic illustration of the case of a mask used for the formation of three-dimensional structures with the combined effect of UV radiation and magnetic field. In said figure, the number 15 designates a binary mask, the letter M designates the photopolymer—magnetic nanoparticles mixture, in which there are defined projections R. The reference 18A designates a top magnetic support, and F designates the beam of UV radiation. In this case the magnetic support 18A performs the function of the electromagnet 18 of FIG. 4.

Figure 6:
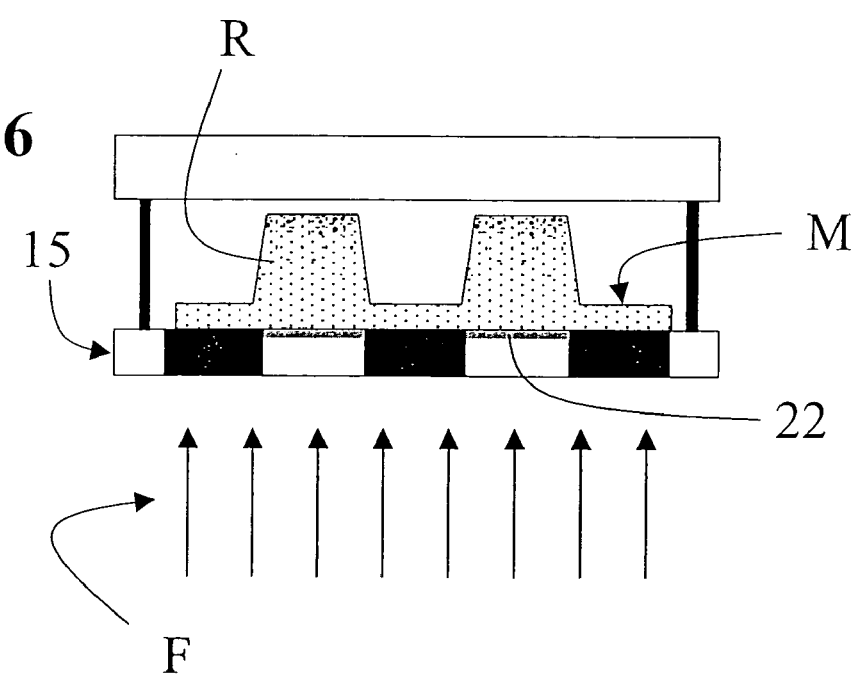
FIGS. 5 and 6 are schematic representations of a first possible embodiment and a second possible embodiment of a part of the apparatus of FIG. 4.

In the case of FIG. 6, an electrical field is, instead, used to obtain the orientation of the nanoparticles of the mixture M, consisting, for example, of electro-rheological materials or liquid crystals. It is to be noted that, in this case, between the binary mask 15 and the mixture M from which the projections R are to be formed there is provided a conductive film 22 for application of the electrical field necessary for orientation of the nanoparticles.

Irrespective of the type of external field applied, in the methodology here proposed there is obtained the initial "swelling" of some areas of the polymeric film M by means of exposure thereof to non-uniform UV radiation, for example by means of the use of a half-tone mask 15 capable of absorbing part of the incident intensity according to the particular pre-defined pattern.

The above type of irradiation, combined with the control in real time of the variation of refractive index, is able to create a non-uniformity in the formation of the polymeric lattice between the lightest areas, i.e., the most illuminated ones, and the darkest areas, i.e., the least illuminated ones, with an initial growth of the projections R by virtue of a phenomenon of transfer of material from the dark areas to the light areas.

The application of the electrical or magnetic field then enables further "growth" of the aforesaid light areas, in order to achieve the height and the geometrical definition desired for the projections R. After formation of the projections R in the way described above, the film M is subjected to complete UV radiation in order to obtain the conclusive polymerization of the mixture. From the practical tests conducted it has been found that the combination of UV rays and external electrical and/or magnetic field creates an evident effect on the height of the projections obtainable, and hence on the aspect ratio of the three-dimensional structure.

The methodology used for generating three-dimensional nanometric structures may, instead, envisage the following steps:

1) solubilization of the orientable nanoparticles in the photopolymeric mixture;
2) deposition of the mixture, in the form of a liquid film, on a transparent substrate;
3) pre-polymerization of the mixture, i.e., its transformation from liquid mixture into gel, by means of exposure to UV rays;
4) growth of the projections by means of a nanometric tip; and
5) conclusive polymerization of the mixture.

Also in this case, the operating steps 1) and 2) may be carried out using techniques in themselves known, and hence will not be described herein; the same applies as regards the production of the transparent substrate referred to in step 2).

FIG. 7 is a schematic representation of the principle of operation of an apparatus used for the purposes of formation of three-dimensional nanometric structures according to the invention.

In FIG. 7, the reference number 30 designates a transparent substrate, on which there is deposited a film of photopolymeric mixture M, including nanomagnets. Following upon said deposition, a beam of UV radiation is generated, designated by F1, which traverses the transparent substrate 30 and impinges upon the film M, as may be noted in the top part a) of FIG. 7. There is obtained thereby a pre-polymerization of the mixture, i.e., a transformation thereof from a liquid state to a gelatinous state.

Once the mixture has been transformed into a gel, adjacent to the film M there is positioned a magnetic tip 31, as may be noted in the central part b) of FIG. 7. The tip 31, which is of nanometric dimensions (having a final diameter of 20–30 nm), can be made of silicon and coated with a magnetic film. The positioning of the tip 31, supported by a respective mobile slide 32, is controlled via software (for example by means of a personal computer) for the generation of projections R.

In this way the film M is subjected locally to the magnetic field generated by the tip 31, according to the pattern set, in order to attract upwards the nanomagnets that form part of the mixture M, according to a principle similar to the one described previously. Also in this case, then, there is witnessed the growth from the film M of the projections R, in the direction of the tip 31.

Finally, as may be noted in the bottom part c) of FIG. 7, associated to the arm bearing the tip 31 is an optical fibre 33, in order to focus a UV beam, designated by F2, in the proximity of the tip itself, and thus cross-link the three-dimensional structure previously formed, i.e., to obtain its definitive polymerization.

From what has been said above, it emerges evident how, by controlling in an appropriate way the slide 32 and hence positioning of the tip 31 and of the optical fibre 33 it is possible to create various types of projections R.

Figure 8:
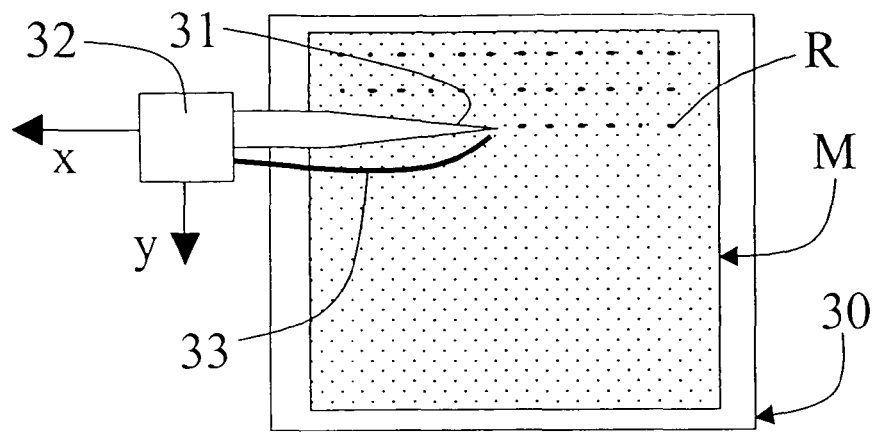
FIGS. 8 and 9 are schematic representations, according to a plan view and to a side view respectively, of a first example of use of the apparatus of FIG. 7.
Figure 9:
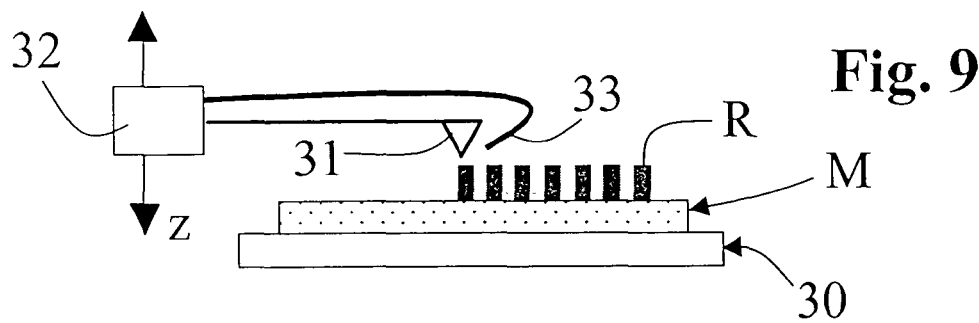
Figure 10:
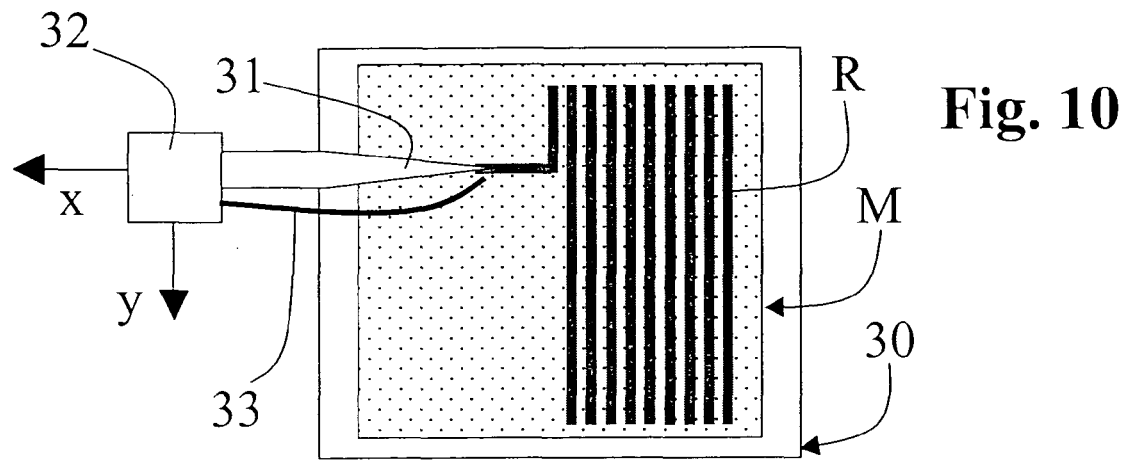
FIGS. 10 and 11 are schematic representations, according to a plan view and to a side view respectively, of a second example of use of the apparatus of FIG. 7.
Figure 11:
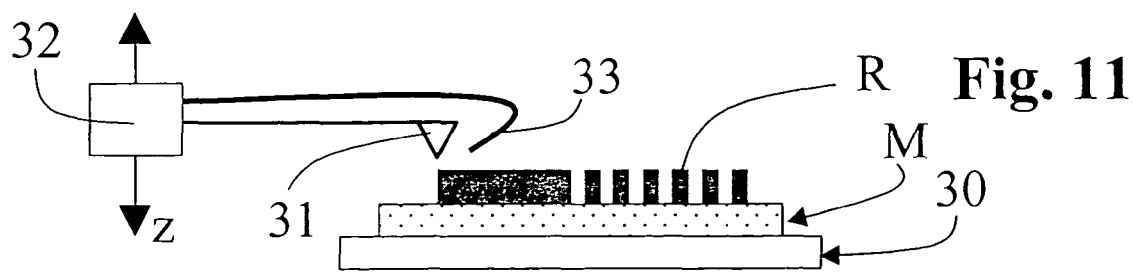

FIGS. 8 to 11 represent, purely by way of example, some possible forms of projections R obtainable with the method described, where, in particular in FIGS. 8 and 9, there is shown the case of point-like projections R, whilst, in FIGS. 10 and 11, there is represented the case of continuous projections R.

From the foregoing description there clearly emerge the characteristics and advantages of the invention. In particular, as has been seen, there is described a new method for producing three-dimensional structures of nanometric or micrometric dimensions by exploiting particular photopolymeric mixtures with orientable nano-inclusions, capable of cross-linking under the influence of UV radiation combined with an electrical or magnetic field.

The apparatus for the control of the state of polymerization, which forms an integral part of the invention, enables a high level of reproducibility of the height, of the precision and of the aspect ratio of the projections obtained.

Of course, without prejudice to the principle of the invention, the details of construction and the embodiments may vary with respect to what is described and illustrated herein purely by way of example.

What is claimed is:

1. A method for making three-dimensional structures of nanometric or micrometric dimensions, wherein the three-dimensional structures are surface projections having a height of up to 500 microns and having defined geometries, wherein the method comprises the following steps:
   (a) obtaining of a photopolymerizable mixture including nanoparticles orientable in space;
   (b) deposition of the mixture on a substrate to form a layer;
   (c) exposure of the layer to UV-radiation to cause polymerization of the photopolymeirzable mixture and control of state of polymerization based on variation of the index of refraction of the layer;
   (d) application of a magnetic and/or electrical field to the layer to produce a desired orientation or positioning of the nanoparticles and to induce the growth of the surface projections from the layer; and
   (e) polymerization of the mixture,
   wherein the nanometric dimensions are dimensions from about 50 nm to 1 µm, and the micrometric dimensions are dimensions from about 50 µm to about 500 µm, and the control of state of polymerization is carried out by detection of the variation of the index refraction of the layer in the areas thereof having different degrees of cross-linking, to consequently modify intensity of the magnetic or electrical field.

2. The method according to claim 1, wherein the exposure of the layer to UV-radiation is concomitant with the application of the magnetic and/or electrical field.

3. The method according to claim 1, wherein the exposure of the layer of the mixture to UV-radiation and the application of the magnetic and/or electrical field occur in an oxygen-free environment.

4. The method according to claim 1, wherein the UV radiation is localized in the areas in which the surface projections are to be formed.

5. The method according to claim 4, wherein the UV radiation is localized by means of a binary mask or a half-tone mask.

6. The method according to claim 1, wherein the layer is exposed to non-uniform UV radiation, with a consequent non-uniformity in the formation of polymeric lattice between areas of the layer most illuminated by UV radiation and areas of the layer least illuminated by UV radiation.

7. The method according to claim 1, wherein the exposure of the layer to UV-radiation transforms the mixture from a liquid state to a gelatinous state.

8. The method, according to claim 7, wherein the application of a magnetic and/or electrical field is carried out by application of a localized magnetic field by means of a magnetic tip.

9. The method according to claim 8, wherein the tip has a nanometric dimension, is made of silicon, and is coated with a magnetic film, wherein the nanometric dimension is a dimension of 20–30 nm.

10. The method according to claim 1, wherein the polymerization of the mixture is carried out by means of exposure thereof to UV radiation in the absence of application of the magnetic and/or electrical field.

11. The method according to claim 10, wherein the polymerization of the mixture is carried out by means of localized exposure of the projections to UV radiation in the absence of the magnetic and/or electrical field.

12. The method according to claim 8, wherein the polymerization of the mixture is carried out by focusing a beam of UV radiation in the proximity of the tip to enable cross-linking of the projections.

13. The method according to claim 1, wherein the photopolymerizable mixture comprises acrylated oligomers and monomers.

14. The method according to claim 1, wherein the orientable nanoparticles are selected from the group consisting of ferrofluids, electro-rheological materials, liquid crystals and magneto-rheological materials.

15. A method for making three-dimensional structures of micrometric dimensions, wherein the three-dimensional structures are surface projections having a height of up to 500 microns and having defined geometries, wherein the method comprises the following steps:

(a) obtaining of a photopolymerizable mixture including nanoparticles orientable in space;

(b) deposition of the mixture on a substrate to form a layer;

(c) exposure of the layer to UV-radiation to cause polymerization of the photopolymeirzable mixture and control of state of polymerization based on variation of the index of refraction of the layer;

(d) application of a magnetic and/or electrical field to the layer to produce a desired orientation or positioning of the nanoparticles and to induce the growth of the surface projections from the layer; and (e) polymerization of the mixture, wherein the micrometric dimensions are dimensions from about 50 μm to about 500 μm, state of polymerization of the layer is controlled by monitoring variation of the index of refraction thereof, and consequently modifying intensity of the applied magnetic or electrical field, and wherein the layer is exposed to non-uniform UV radiation, thereby producing a non-uniformity in polymeric lattice formation between areas of the layer most illuminated by UV radiation and areas of the layer least illuminated by UV radiation, and variation of the index refraction is monitored by detecting intensity distribution of orders of diffraction in areas of the layer having different degrees of cross-linking.

16. A method for making three-dimensional structures of nanometric dimensions, wherein the three-dimensional structures are surface projections having a height of up to 1 micron and having defined geometries, wherein the method comprises the following steps:

(a) obtaining of a photopolymerizable mixture including nanoparticles orientable in space;

(b) deposition of the mixture on a substrate to form a layer;

(c) exposure of the layer to UV-radiation to initially transform the photopolymerizable mixture from a liquid state to a gelatinous state, and control of polymerization state of the layer;

(d) application of a magnetic field to the layer to produce a desired orientation or positioning of the nanoparticles and to induce the growth of the surface projections from the layer; and (e) conclusive polymerization of the mixture, wherein the nanometric dimensions are dimensions from about 50 nm to 1 μm, step (d) comprises application of a localized magnetic field to the layer by means of a magnetic tip to induce growth of a projection from the layer, and step (e) comprises focusing a beam of UV-radiation in the proximity of the tip, to cause cross-linking of the projection.

* * * * *